US009470754B1

(12) United States Patent
Chickermane et al.

(10) Patent No.: US 9,470,754 B1
(45) Date of Patent: Oct. 18, 2016

(54) ELASTIC COMPRESSION-OPTIMIZING TESTER BANDWIDTH WITH COMPRESSED TEST STIMULI USING OVERSCAN AND VARIABLE SERIALIZATION

(71) Applicant: Cadence Design Systems, Inc., San Jose, CA (US)

(72) Inventors: Vivek Chickermane, Slaterville Springs, NY (US); Krishna Vijaya Chakravadhanula, Vestal, NY (US); Brian Edward Foutz, Charlottesville, VA (US); Steev Wilcox, San Jose, CA (US); Paul Alexander Cunningham, Mountain View, CA (US); David George Scott, Endwell, NY (US); Louis Christopher Milano, Endwell, NY (US); Dale Edward Meehl, Melbourne, FL (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/737,331

(22) Filed: Jun. 11, 2015

(51) Int. Cl.
G01R 31/28 (2006.01)
G01R 31/3177 (2006.01)

(52) U.S. Cl.
CPC .................. *G01R 31/3177* (2013.01)

(58) Field of Classification Search
CPC ..... H04L 25/14; H04L 7/0008; H04L 7/0037; H04L 7/005; H04L 7/044
USPC ............................................ 714/729
See application file for complete search history.

(56) References Cited

U.S. PATENT DOCUMENTS

| 8,904,256 | B1* | 12/2014 | Chakravadhanula | G01R 31/318547 |
| | | | | 714/729 |
| 2004/0216026 | A1* | 10/2004 | Ferraiolo | G06F 11/221 |
| | | | | 714/758 |
| 2006/0190668 | A1* | 8/2006 | Biran | G06F 13/4059 |
| | | | | 710/315 |
| 2015/0193316 | A1* | 7/2015 | Dreps | G06F 11/24 |
| | | | | 714/4.5 |

* cited by examiner

*Primary Examiner* — David Ton
(74) *Attorney, Agent, or Firm* — Kenyon & Kenyon LLP

(57) ABSTRACT

Systems and methods disclosed herein provide for utilizing extra variables in the decompression equation set of an ATPG process for test patterns requiring an excess number of care bits than can be supported efficiently by the current hardware. An elastic interface is utilized between a tester and a decompressor network (e.g., sequential and combinational decompressors) in order to expand the test pattern length and/or the number of input variables. The systems and methods also provide care bits in early scan cycles of the ATPG process for sequential decompressors starting from a fixed state.

20 Claims, 11 Drawing Sheets

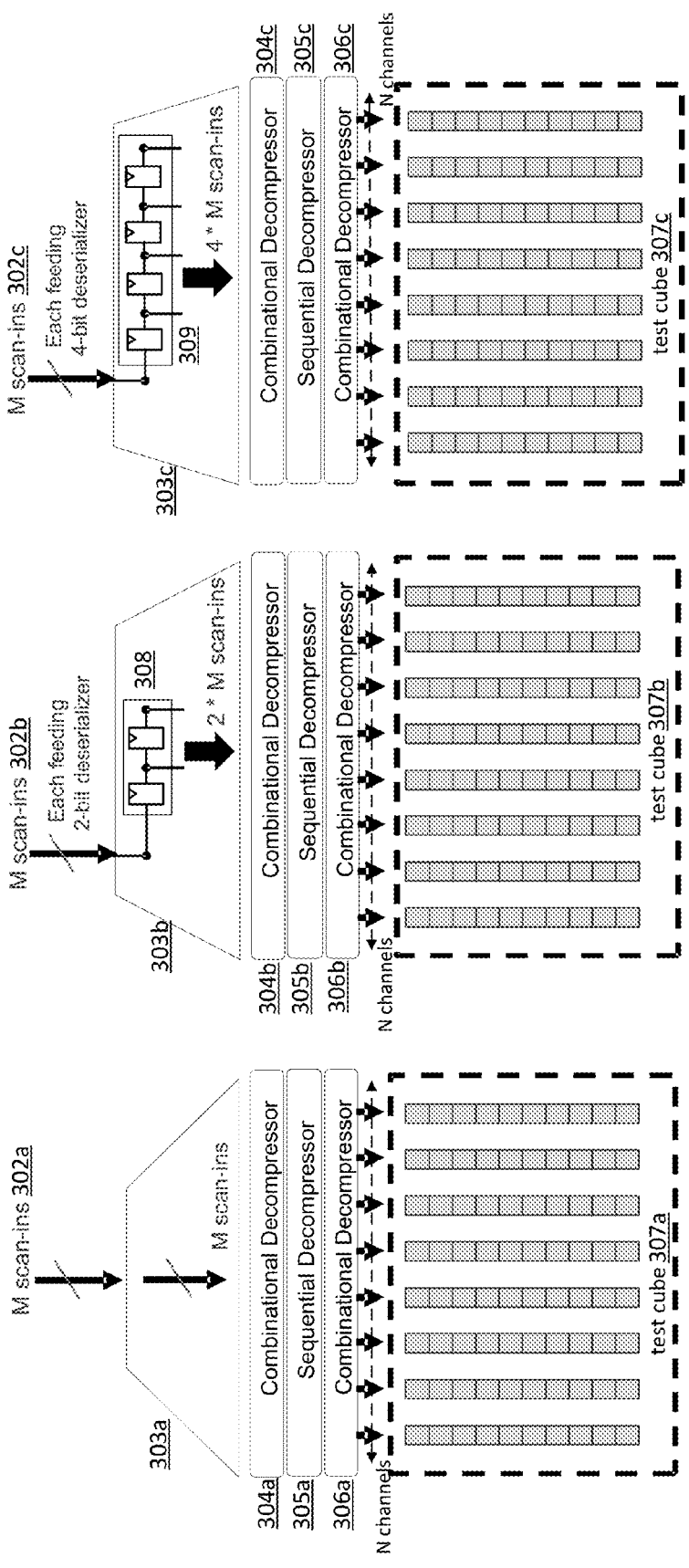

System 500

FIG. 5B

Equations for Channel bits after running for 5 scan clock cycles

|  | | | | | |
|---|---|---|---|---|---|
| Slice 3 | L3+S21+L1+S23+ S14+L2+L4+S22+ S13 | L2+L4+S22+S13+ S12+L1+S23 | L3+S21+S12+S11+ L2+S22 | S12+L1+S23+S11+ L2+S22+S24 | L3+S21+L1+S23+S1 4+S11+L2+S22+S24 |
| Slice 2 | L2 + L4 +S22 + S13 +L3+S21+S12 | L3+S21+S12+S11+ L2+S22 | S11+L2+S22+L3+ S21+L1+S23 | L2+L4+S22+S13+ L3+S21+L1+S23 |
| Slice 1 | L3 + S21 + S12 + L4 + S11 | L4 + S11 + L3 + S21 + L1 | L3 + S21 + L1 + L2 + L4 + S22 | L3 + S21 + L1 + L2 + L4 + S22 | L3 + S21 + L2 + L4 + S22 |
| Flushed out | L4 + S11 + L1 | L1 + L2 + L4 | L2 + L4 + L3 + S21 | L4 + S11 + L3 + S21 |
| Flushed out | L1 + L2 | L2 + L3 | L3 + L4 | L4 + L1 |

FIG. 5C

PRPG state after 5 clock cycles

|  | | | | | |
|---|---|---|---|---|---|
| After cycle 5 | S11 + L2 + S22 + S24 + S15 | L3 + S21 + L1 + S23 + S14 | L2+L4+S22 + S13 | L4 + S13 + S11 + S24 | S12 + L1 + S23 + S25 |
| After cycle 4 | L3+S21+L1 + S23 + S14 | L2 + L4 + S22 + S13 | S12 + L1 + S23 | S11 + L2 + S22 + S24 |
| After cycle 3 | L2 + L4 + S22 + S13 | L3 + S21 + S12 | S11 + L2 + S22 | L3 + S21 + L1 + S23 |
| After cycle 2 | L3 + S21 + S12 | L4 + S11 | L3 + S21 + L1 | L2 + L4 + S22 |
| After cycle 1 | L4 + S11 | L1 | L2 + L4 | L3 + S21 |
| Initial State | L1 | L2 | L3 | L4 |

FIG. 6B

Equations for Channel bits after running for 5 scan clock cycles

|  |  |  |  |  |
|---|---|---|---|---|
| Slice 3 | L3+S11+L1+S21+S24+S25+S18+L2+L4+S22+S23+S16+S17 | L2+L4+S22+S23+S16+S17+S14+L1+S15+S11+S24+S25+S28 | S14+L1+S15+S11+S24+S25+S28+S12+S13+L2+S22+S23+S26+S27 | L1+S11+L3+S21+S24+S25+S18+S12+S13+L2+S22+S23+S26+S27 |
| Slice 2 | L2 + L4 +S22 + S23 + S16 +L3+S21+S14 + S15 | L3+S21+S14+S15+S12 + L2 + S13 + S22 + S23 + S26 | S12+L2+S13+S22+S23+S26+L3+L1+S11 + S21+S24+S25 | L2+L4+S22+S23+S16+L3+S11+L1+S21+S24+S25 |
| Slice 1 | L3 + S21 + S14 + L4 + S12 + S13 | L4 + S12 + S13 + L3 + S21 + L1 + S11 + S24 | L3 + S21 + L1 + S11 + S24 + L2 + L4 + S22 + S23 | L3 + S21 + L1 + S14 + L2 + S22 + S23 |
| Flushed out | L4 + S12 + L1 + S11 | L1+S11+L2+L4+ S22 | L2 + L4 + S22 + L3 + S21 | L4 + S12 + L3 + S21 |
| Flushed out |  | L2 + L3 | L3 + L4 | L4 + L1 |

FIG. 6C

|  |  |  |  |  |
|---|---|---|---|---|
| After cycle 5 | S12 + S13 + L2 + S22 + S23 + S26 + S27 + S110 | L3 + S11 + L1 + S21 + S24 + S25 + S18 + S19 | L4 + S16 + S17 + S12 + S13 + S26 + S27 + S28 + S29 | S14 + S15 + L1 + S11 + S24 + S25 + S28 + S29 |
| After cycle 4 | L1 + S11 + L3 + S21 + S24 + S25 + S18 | L2 + L4 + S22 + S23 + S16 + S17 | S14 + L1 + S15 + S11 + S24 + S25 + S28 | S12 + S13 + L2 + S22 + S23 + S26 + S27 |
| After cycle 3 | L2 + L4 + S22 + S23 + S16 | L3 + S21 + S14 + S15 | S12 + L2 + S13 + S22 + S23 + S26 | L1 + S11 + L3 + S21 + S24 + S25 |
| After cycle 2 | L3 + S21 + S14 | L4 + S12 + S13 | L3 + S21 + L1 + S11 + S24 | L2 + L4 + S22 |
| After cycle 1 | L4 + S12 | L1 + S11 | L2 + L4 + S22 | L3 + S21 |
| Initial State | L1 | L2 | L3 | L4 |

ELASTIC COMPRESSION-OPTIMIZING TESTER BANDWIDTH WITH COMPRESSED TEST STIMULI USING OVERSCAN AND VARIABLE SERIALIZATION

TECHNICAL FIELD

The present application relates to systems and methods for generating test patterns in testing integrated circuit designs.

CROSS-REFERENCE TO RELATED APPLICATIONS

This application is related to U.S. patent application Ser. No. 14/754,351, entitled "Method and System for Improving Efficiency of XOR-based Test Compression using an Embedded DeSerializer," with U.S. patent application Ser. No. 14/754,386, entitled "Method and System for Improving Efficiency of Sequential Test Compression Using Overscan," and with U.S. patent application Ser. No. 14/754,403, entitled "Method and System for Construction of a Highly Efficient and Predictable Sequential Test Decompression Logic."

BACKGROUND

Automatic test pattern generation ("ATPG") was developed to explicitly test each gate and path in an integrated circuit ("IC") design. As ICs have become larger and more complex, the amount of logic to be tested per input/output test pin has increased dramatically.

Generally, when an ATPG tool generates a scan test pattern for a fault, or a set of faults, only a small percentage of scan cells in the scan channels need to take specific values (e.g., care bits). The rest of the cells in the scan channel are "don't care", and are usually filled with random values. Relatively few bits are "care" bits.

Test Compression is a technique used as part of a Design For Test ("DFT") method to reduce the time and cost of testing integrated circuits. Straightforward application of scan techniques can result in large vector sets with corresponding long tester time and memory requirements. Test Compression takes advantage of the small number of significant values (care bits) techniques to reduce test data and test time, by decompressing the scan input on chip and compressing the test output. This technique allows highly compressed test stimuli to be applied from low-pin count testers and compressed test responses to be measured.

Scan channels are typically loaded by shifting them into the design registers 1 bit per clock cycle and thus, the longer the scan channels the more time it takes to load. The loading and unloading of long scan channels is not a very efficient use of tester time. A Test decompressor allows compressed test stimuli to be loaded from a small number of tester pins to a large number of very short internal scan channels; thereby reducing the test loading time. On the output side the short scan channels feeding a test compressor can reduce the time taken to unload the test response and store it on the tester for comparison.

However, as Test Compression decreases channel lengths, the number of specified bits (e.g., care bits) per time slice increases. Further, at higher compression ratios, because the channel length is decreasing, the total number of variables (e.g., scan data) and, hence, the total number of care bits that can fit into a test pattern, are reduced. In addition, there can be a large variance in the number of care bits across time slices.

XOR decompressors (e.g., a linear spreader network of a plurality of XOR logic gates) are limited in that they are restricted to using only the scan data available in the same scan cycle. This places an upper bound on the number of care bits that are in the same scan cycle. This also leads to inefficiencies. For ample, if the ATPG generated test does not require any care bits or requires very few care bits in a test slice, the slack (e.g., unused scan data) cannot be re-used for a different scan cycle that has more care bits.

Sequential decompressors overcome the above-discussed inefficiencies of the XOR decompressors by solving the linear equations of the entire test pattern simultaneously instead of slice-by-slice. Specifically, each equation of the system of equations corresponds to a channel bit associated with a care bit. Scan data is reused among multiple test slices, so that scan data from test slices having fewer care bits can be utilized in solving for test slices with more care bits. However, sequential decompressors are still limited by the size of a scan cube (which includes, among other things, a number of scan slices). In other words, even though the scan data from the scan cube is used more efficiently, the total amount of information (e.g., scan data) in the scan cube is still the same. For example, the total number of bits for each ATPG test would be the length of the channel (L) multiplied by the number of scan-in inputs (M) (i.e., L*M). Thus, with the current solutions, sequential decompressors are limited to solving up to L*M number of care bits. In other words, faults requiring less than L*M care bits are potentially solvable; however, if the fault requires more care bits than the L*M value, then that fault will most likely be undetectable. For example, if only 250 bits of scan data are brought in, and the fault requires 500 care bits to detect the fault, then that fault will most likely not be detected. Therefore, as the channel length decreases, the likelihood of solving for substantially all of the faults in the circuit also decreases.

Further, as the channel length L decreases, the number of faults that can be detected per test pattern also decreases. For example, assuming the scan data from above, if multiple faults each require care bits in the range of 50-60 bits, which, individually, should generally be solvable, the probability of these faults conflicting is increased. Two or more faults are deemed to conflict when the two or more faults require conflicting values at the exact same bit position. For example, one fault might require the care bit hold a "1" at a certain bit position while another fault requires the care bit hold a "0" at the bit position. Therefore, if two faults conflict, the conflicting faults cannot be solved for with a single test pattern. Thus, additional test patterns are required to test for one of the conflicted faults. Accordingly, as the number of required test patterns increases, the test time and total data volume also increases, defeating one of the primary motivations for test compression, i.e., decreasing test time and total data volume.

Further, sequential decompressors are also limited in that the initial test slices (e.g., the test slice closer to the scan out) for the sequential decompressor will have equations comprising only the starting state values of a linear feedback shift register ("LFSR") (also referred to as a Pseudo-Random Pattern Generator—PRPG) utilized in the sequential decompression. Accordingly, any care bits in these bit positions will likely not be solved. Traditionally, to overcome the aforementioned starting-state problem of the PRPG, the PRPG was loaded with scan input variables before any values were shifted into the scan channels. However, this required that the channels be frozen while the scan input variables were being loaded into the PRPG (e.g., by holding the channels' clocks constant), which required an additional test control pin or other internal hardware to achieve.

Accordingly, there is a need for an efficient method and system of bringing additional variables from a scan cube, as desired, for certain test patterns without simultaneously increasing the length of the scan channels.

Further, there is also a need for an efficient method of bringing additional variables into the PRPG in the early cycles of the ATPG process without utilizing any additional hardware or control pins.

BRIEF DESCRIPTION OF THE DRAWINGS

FIG. 3A illustrates an embodiment of the multi-stage decompressor network system of FIG. 2 without the use of a deserializer.

FIG. 3B illustrates an embodiment of the multi-stage decompressor network system of FIG. 2 with a 2-bit deserializer.

FIG. 3C illustrates an embodiment of the multi-stage decompressor network system of FIG. 2 with a 4-bit deserializer.

FIG. 5B illustrates the linear equations for the scan channel bits after the sequential decompressor of FIG. 5A runs for longer than the length of the longest scan channel.

FIG. 5C illustrates the state of each bit in the PRPG of FIG. 5A after running for longer than the length of the longest scan channel.

FIG. 6B illustrates the linear equations for the scan channel bits after the sequential decompressor of FIG. 6A runs for longer than the length of the longest scan channel.

FIG. 6C illustrates the state of each bit in the PRPG of FIG. 6A after running for longer than the length of the longest scan channel.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods for efficiently bringing in more variables, when needed, in order to map the compressed patterns stored on the tester to the required test patterns needed to test the faults. The methods and apparatuses herein address at least one of the ATPG problems described above. Accordingly, a multi-stage decompressor network system with a variable length deserializer is provided to stretch certain patterns to ensure optimal pattern set generation. Another aspect of the present disclosure is to provide systems and methods for efficiently bringing in additional variables into the linear equations that describes the decompressor network in the early cycles of the ATPG process without utilizing any additional hardware or control pins. Accordingly, a method of overscanning (e.g., scanning longer than the length of the longest channel) fir some additional cycles is provided to bring in enough variables into the decompressor network.

According to an embodiment, an automatic test pattern generation system includes: an elastic interface, configured to receive m scan inputs from a tester, wherein, in a first state, the elastic interface outputs the m scan inputs, and, in a second state, the elastic interface outputs i×m scan inputs, wherein i is an integer greater than 1; a sequential decompressor receiving a plurality of outputs from the elastic interface; a first combinational decompressor network receiving a plurality of outputs from the sequential decompressor; and a plurality of scan channels receiving a plurality of outputs from the first combinational decompressor network.

Figure 1A:
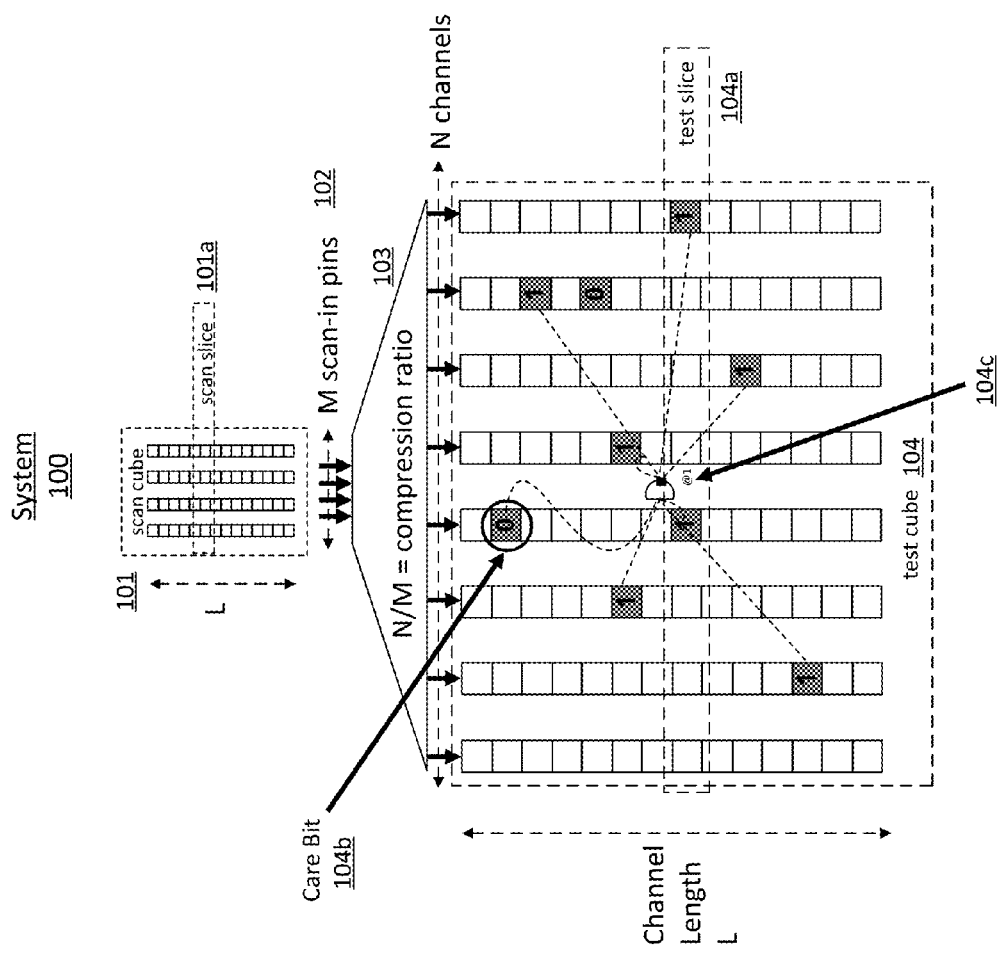
FIG. 1A illustrates elements of a decompressor network system utilized during automatic test pattern generation.

FIG. 1A illustrates elements of a system 100 utilized during automatic test pattern generation. System 100, utilizing scan cube 101 (which includes a scan slice 101a among a plurality of scan slices), includes scan-in pins 102, decompressor 103, producing test cube 104 (which includes a test slice 104a among a plurality of test slices, as well as care bits 104b, and an indication 104c of a faulty AND gate). In an embodiment, scan cube 101 is the generated test pattern that will be applied to a potential digital circuit in order to distinguish between proper circuit behavior and faulty circuit behavior caused by defects. Accordingly, in an embodiment, scan slice 101a will be applied to flip-flops associated with the location of scan slice 101a during the test of the digital circuit. In an embodiment, during the automatic test pattern generation process, care bits 104b are placed throughout the various test slices 104a of the scan channels of test cube 104 in order to test fir faults. For example, in order to properly detect fault 104c, care bit 104b (as well as other care bits indicated by a binary value of either 1 or 0) are required to be placed in specified locations in the scan channels as illustrated in FIG. 1A. In an embodiment, the fault to be tested for in the digital circuit is an AND gate which is stuck-at 1 (e.g., an individual pin is stuck at a logical 1'). Further, as depicted in FIG. 1A, the compression ratio of decompressor 103 refers to the ratio of the number of the channels N to the number of the scan-in pins M.

In an embodiment, an equation solver solves for the variables (e.g., scan-in pin 102 inputs) necessary to generate the desired care bits (e.g., 104b) at each scan slice of the scan channels. Each channel input of the scan slice generally corresponds to a different Boolean combination (e.g., due to the decompressor 103) of the input bit variables (e.g., scan-in pin 102 inputs). Accordingly, each scan slice corresponds to a plurality of linear equations (e.g., ax=b). With the Boolean combinations provided by the decompressor 103 (e.g., the "a") and the corresponding care bit values (e.g., the "b") for each of the scan channels of the scan cycle, the equation solver can solve for the desired scan input variables (e.g., the "x"). After the equation solver determines the desired scan input variables, the variables are extracted to a corresponding location in the scan cube 101.

Figure 1B:
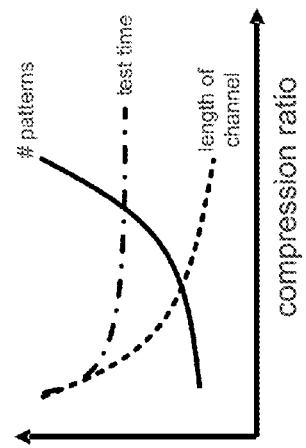
FIG. 1B illustrates a graph depicting a relationship between the compression ratio and (i) the number of test patterns, (ii) channel length, and (iii) test time for the decompressor network system in FIG. 1A.

Further, for each of the care bits 104b in the test cube 104, there is a corresponding bit in the scan cube 101. For example, if there are 9 care bits corresponding to a certain fault 104c, then up to 9 bits of scan data (e.g., desired scan input variables) from the scan cube 101 may be required to solve for those care bits. The equation solver cannot detect any faults with more care bits than bits in the scan cube 101. Accordingly, at some compression ratio beyond a number, there is going to be a reduction in the coverage. Specifically, as the compression ratio increases, the length of the channels decreases while the number of scan pins 102 remains the same. As the length of the channels decreases, the amount of information that can be brought in through the scan cube starts to shrink. With shorter channel lengths, fewer faults can be packed into a scan cube and, therefore, more test patterns are required to test the same number of faults as can be tested by a larger scan cube. Thus, because there is an increase in the number of patterns, as the compression ratio increases, the test time converges to a steady value instead of decreasing (FIG. 1B).

Figure 2:
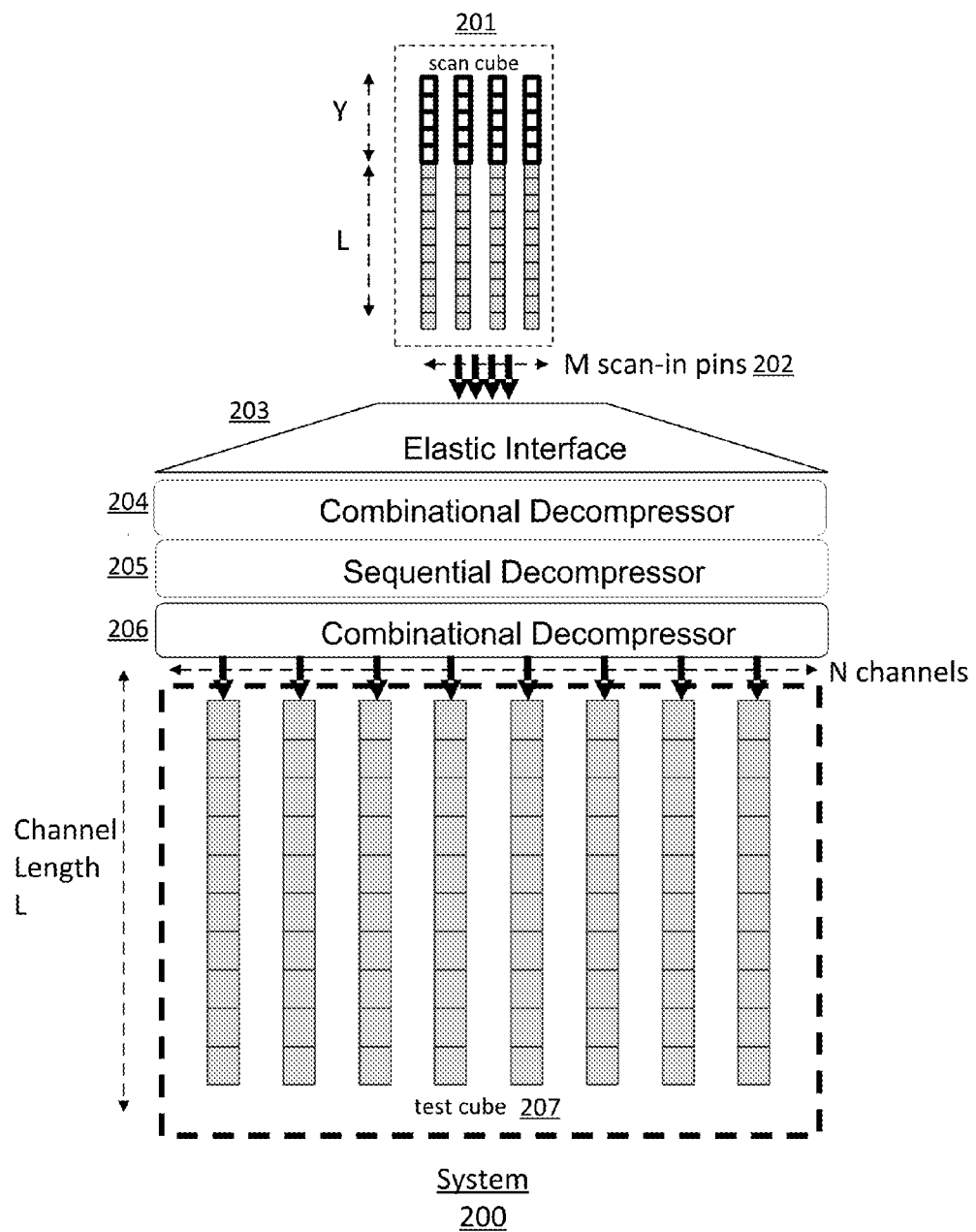
FIG. 2 illustrates an embodiment of a multi-stage decompressor network system with an elastic interface.

FIG. 2 illustrates an embodiment of a multi-stage decompressor network system with an elastic interface. In an embodiment, system 200 includes a scan cube 201, M scan-in pins 202, elastic interface 203, combinational decompressor 204, sequential decompressor 205, combinational decompressor 206 and test cube 207. In an embodiment, scan cube 201 feeds the M scan-in pins 202. The M scan-in pins 202 feed the elastic interface 203. The elastic interface 203 feeds the combinational decompressor 204. The sequential decompressor 205 feeds the combinational decompressor 206, which in turn feeds the channels of test cube 207. In another embodiment, the elastic interface 203 feeds the sequential decompressor 205 instead of combinational decompressor 204 (i.e., combinational decompressor 204 is not utilized in system 200). In an embodiment, with the elastic interface 203, system 200 is able to expand the scan cube 201 in order to meet specific fault/pattern requirements. Specifically, the elastic interface 203 is configured to provide additional variables (i) as necessary for certain test patterns (ii) in order to solve for care bits in early scan cycles and (iii) to test multiple faults in the same test pattern. The elastic interface 203 essentially breaks the 1:1 relationship between the rows in the test cube 207 and the rows in the input scan cube 201. Accordingly, additional variables could be provided with the scan cube 201 independent of the length of the scan channels in test cube 207. Therefore, the channel configuration (and physical wiring) of the scan channels in test cube 207 is not impacted as the scan cube 201 provides additional variables to the scan channels through the elastic interface 203. In other words, with the elastic interface 203, it is possible to artificially increase the vertical length (e.g., y-dimension) of the scan cube by an additional length Y. In an embodiment, additional length Y corresponds to additional variables in the scan cube 201 that can be utilized (i) to solve for certain test patterns and (ii) during an overscan operation (which will be discussed in detail in the following figures).

In an embodiment, with the elastic interface 203, system 200 is able to expand the scan cube 201 by artificially increasing the horizontal width (e.g., x-dimension) by a factor of i without physically increasing the number of physical scan in pins. In an embodiment, the elastic interface includes an i-bit deserializer (e.g., 2 or 4-bit) and a multiplexer stage. In an embodiment, the i-bit deserializer virtually extends the number of scan-in input pins. For example, with a 2-bit deserializer, the number of scan-in inputs M would virtually double as seen by the decompression logic under test. Therefore, the 2-bit deserializer essentially generates M virtual scan-in inputs in addition to the actual M scan-in pins 202. Similarly, with a 4-bit deserializer, the number of scan-in inputs would virtually quadruple and, therefore, 3*M virtual additional scan-in inputs would be generated. In an embodiment, the virtual scan-in inputs for either the 2-bit or 4-bit deserializer would be included in the additional length Y of the scan cube. For example, assuming (i) the length of the channels L is 100 and (ii) a 2-bit deserializer is used, then the total number of rows in scan cube 201 would be 200 (i.e., the additional length Y is 100). Further, additional length Y could be further extended to include rows utilized during an overscan operation.

In an embodiment, the multiplexer stage determines whether the system 200 operates with or without the i-bit deserializer of the elastic interface. In an embodiment, the ATPG process utilizes the i-bit deserializer of the elastic interface for a small percentage of faults (e.g., for faults with a high number of care bits). Accordingly, for the most part, the bulk of the ATPG process would be performed without the i-bit deserializer.

In an embodiment, combinational decompressors 204 and 206 correspond to any type of combinational decompressor (e.g., linear spreader network of XOR logic gates, Illinois scan/broadcast scan distribution network, etc.). In an embodiment, either of combinational decompressors 204 and 206 can include a first combinational decompressor structure when the i-bit deserializer is not used and a second combinational decompressor structure when the i-bit deserializer is used. Likewise, the sequential decompressor 205 corresponds to any type of sequential decompressor (e.g., a first-in, first-out ("FIFO") linear shift register, PRPG, etc.). In other words, the elastic interface 203 can be utilized with any feasible combination of the combinational and sequential decompressors.

FIG. 3A illustrates an embodiment of the multi-stage decompressor network system of FIG. 2 without the use of a deserializer. In an embodiment, elastic interface 303a would be utilized for the bulk of the ATPG process (i.e., without a need for additional input variables). Accordingly, the multi-stage decompressor network system of FIG. 3A is limited to the M scan-ins 302a originally provided.

FIG. 3B illustrates an embodiment of the multi-stage decompressor network system of FIG. 2 with a 2-bit deserializer. As depicted in FIG. 3B, because each of the M scan-ins 302b feeds a 2-bit deserializer, the compression engine (i.e., combinational decompressor 304b, sequential decompressor 305b, and combinational decompressor 306b) sees 2*M scan-ins. For example, if there were originally 8 scan-ins, the elastic interface 302b would provide 16 scan-ins (8 of which are virtual) to the compression engine. Accordingly, the compression ratio (number of channels N divided by the number of scan-ins M) of the multi-stage decompressor network system would halve. For example, assuming there are 3200 channels, (i) without the 2-bit deserializer, the compression ratio would be (3200 channels/8 scan-ins) or 400 and (ii) with the 2-bit deserializer, the compression ratio would be (3200 channels/16 scan-ins) or 200.

FIG. 3C illustrates an embodiment of the multi-stage decompressor network system of FIG. 2 with a 4-bit deserializer. Similarly to FIG. 3B, in FIG. 3C, because each of the M scan-ins 302c feeds a 4-bit deserializer, the compression engine (i.e., combinational decompressor 304c, sequential decompressor 305c, and combinational decompressor 306c) sees 4*M scan-ins. Thus, instead of the 8 scan-ins originally provided, the elastic interface 303c would provide 32 scan-ins (24 of which are virtual) to the compression engine. Accordingly, the compression ratio (number of channels N divided by the number of scan-ins M) of the multi-stage decompressor network system would be quartered. For example, assuming there are 3200 channels, with the 4-bit deserializer, the compression ratio would be (3200 channels/32 scan-ins) or 100.

Figure 4A:
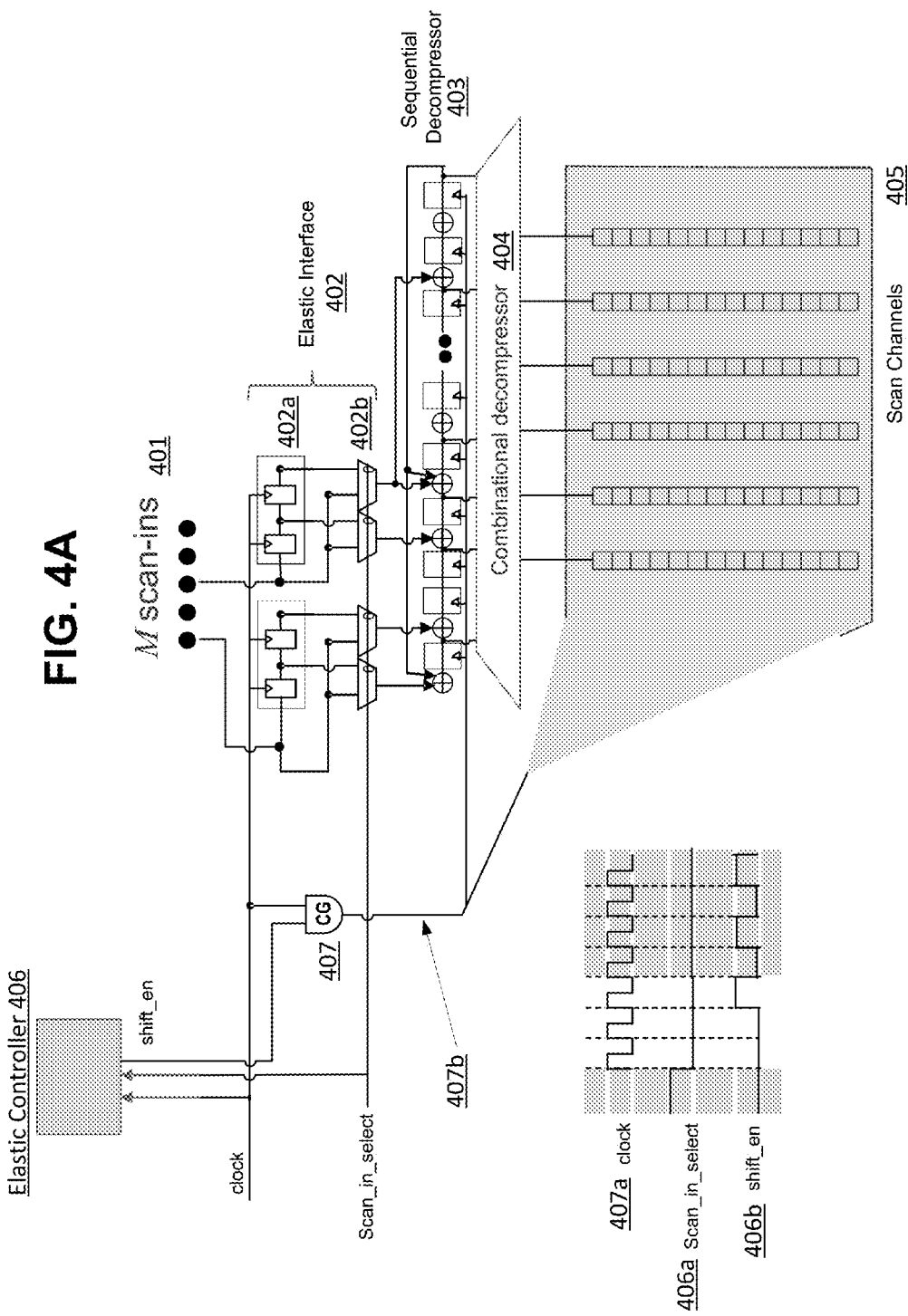
FIG. 4A illustrates an embodiment of elements of the multi-stage decompressor network system with a 2-bit deserializer.

FIG. 4A illustrates an embodiment of elements of the multi-stage decompressor network system with a 2-bit deserializer. In an embodiment, system 400 includes M scan-in pins 401 (e.g., to receive inputs from the tester), elastic interface 402, sequential decompressor 403, combinational decompressor 404, Elastic Controller 406, clock gate 407, and scan channels 405. Embodiments may include one or more of the following. For example, elastic interface may include an i-bit (e.g., 2 or 4-bit) deserializer 402a and a multiplexer ("MUX") stage 402b. As another example, assuming a 2-bit deserializer, each of the M scan-in inputs 401 (i) may connect to a corresponding 2-bit deserializer 402a and (ii) may fan out to a first input of each of the two MUXes of MUX stage 402b (i.e., the same scan-in input is distributed to the two MUXes). As yet another example, the 2-bit deserializer 402a may need two clock cycles to load each shift register of the deserializer. The output of each shift register of the 2-bit deserializer 402a may feed a second input of the MUXes of MUX stage 402b. In an embodiment, the outputs of the MUXes in MUX stage 402b feed a plurality of inputs at the sequential decompressor 403.

In an embodiment, the MUX stage 402b allows the sequential decompressor 403 to be fed by either the scan-in inputs (e.g., the first state) or the output of each of the shift registers of the 2-bit deserializer (e.g., the second state). For example, during the first state of the MUX stage 402b, a duplicate of the signal at scan-in pin 401 is input into a plurality of different tap points of the sequential decompressor 403. In an embodiment, a tap point can refer to an input of any of the shift registers in the sequential decompressor. Further, a tap point could also refer to a logic gate (e.g., an XOR gate) connected to the input of any of the shift registers in the sequential decompressor. During the second state of the MUX stage 402b, the output of each of the shift registers of the 2-bit deserializer 402a is input into a plurality of tap points of the sequential decompressor 403. In an embodiment, unlike the first state of the MUX stage 402b (i.e., fan out of the same signal to a plurality of tap points of the sequential decompressor 403), during the second state of the MUX stage 402b, the signals received at the plurality of tap points of the sequential decompressor 403 is likely to be different (i.e., because they correspond to different scan slices of a scan cube at the tester).

Specifically, depending on a signal input (e.g., a signal 406a to Elastic Controller 406) on a third input of each of the MUXes (e.g., the select line), the sequential decompressor 403 is fed by either the duplicated input signal or the outputs of each of the shift registers of the 2-bit deserializer 402a. In an embodiment, if the signal at the select line of the MUXes is "1," the MUX stage 402b will operate under the first state. On the other hand, if the signal at the select line of the MUXes is "0," the MUX stage 402b will operate under the second state.

During normal operation of the decompressor network, i.e., when the number of care bits to solve during the ATPG process is far less than the total number of bits at the scan cube, the MUX stage 402b will most likely operate under the first state. However, if the ATPG process runs into a group of linear of equations for a certain fault that cannot be solved (e.g., because of a high number of care bits), the ATPG process would switch to the second state of the system. In an embodiment, the ATPG process would operate under the second state after the equation solver initially solves for all of the other solvable faults. In an embodiment, the ATPG process determines if a system of equations is unsolvable for a certain test pattern if the equation solver is unable to solve the system of equations that determine the mapping from compressed patterns stored on the tester to the specific care bits to be loaded into the scan channels. In an embodiment, after (i) the equation solver solves for all of the solvable faults and (ii) it is determined by the equation solver that certain faults are unsolvable, signal 406a goes low (i.e., "0") and is transmitted to (i) the select line of MUX stage 402b and (ii) Elastic Controller 406 to initiate the second state. In an embodiment, in response to signal 406a, the Elastic Controller 406 transmits a "low" (i.e., "0") signal 406b to the clock gate 407. In an embodiment, clock gate 407 is connected to the shift clocks of all of the flip-flops in the scan channels 405 as well as all of the shift registers of the sequential decompressor 403. In another embodiment, scan channels 405 and sequential decompressor 403 receive the same clock signal 407b (i.e., the scan channels 405 and sequential decompressor 403 are in sync). In an embodiment, if signal 406b is high, the sequential decompressor 403 and the scan channels 405 will shift down values. Otherwise, if signal 406b is low, the clocks to the sequential decompressor 403 and the scan channels 405 will freeze and, thus, no values will shift down through the sequential decompressor 403 or the scan channels 405. In an embodiment, the clocks to the flip-flops of the scan channels 405 and the shift registers of the sequential decompressor 403 are first frozen in order to reset the values at the shift registers of the deserializer 402a and sequential decompressor 403. In an embodiment, because the shift registers of the deserializer 402a and sequential decompressor 403 may start in an unknown state at the beginning of the test, the shift registers of the deserializer 402a and sequential decompressor 403 need to be reset in order to start the process with a known state. Once the shift registers of the deserializer 402a and sequential decompressor 403 are reset, the Elastic Controller would initiate the waveforms (i.e., 406b) depicted in FIG. 4A. Specifically, during the first two cycles after reset, (i) the clocks to the flip-flops of the scan channels 405 and the shift registers of the sequential decompressor 403 are frozen (i.e., no values from the sequential decompressor 403 and the scan channels 405 are shifted down) and (ii) the shift registers of the deserializer 402a are loaded with values from the tester. For example, during the first cycle, a signal is loaded to a first shift register of the deserializer 402a and, during the second cycle, (i) the signal at the first shift register is shifted to a second shift register and (ii) the first shift register is loaded with a new value. Then, during the third cycle, (i) the clocks to the flip-flops of the scan channels 405 and the shift registers of the sequential decompressor 403 are unfrozen, (ii) values at each of the shift registers of the deserializer 402a are shifted down to a plurality of tap points at the sequential decompressor and (iii) a new value from the tester is loaded at the first shift register. In the next cycle, (i) the clocks are frozen again, (ii) signal at the first shift register is shifted to the second shift register and (iii) the first shift register is loaded with a new value. Similarly, at the next cycle after that, (i) the clocks to the flip-flops of the scan channels 405 and the shift registers of the sequential decompressor 403 are unfrozen, (ii) values at each of the shift registers of the deserializer 402a are shifted down to a plurality of tap points at the sequential decompressor and (iii) a new value from the tester is loaded at the first shift register. Accordingly, for every other cycle going forward, new data from the tester is pumped in to the sequential decompressor 403 and then shifted down to the sequential decompressor 403. Thus, during the second state, the equation solver is provided with twice as many variables as necessary to utilize in the system of equations for a particular fault.

In an embodiment, the output of the sequential decompressor 403 feeds a combinational decompressor 404, which in turn may feed the scan channels 405.

In an embodiment, an extractor (not shown) (i) extracts the solution (e.g., the required spread of input variables to detect the desired care bits) after the system of equations corresponding to the certain fault is solved and (ii) transmits the solution to a corresponding scan cube stored in a database.

Figure 4B:
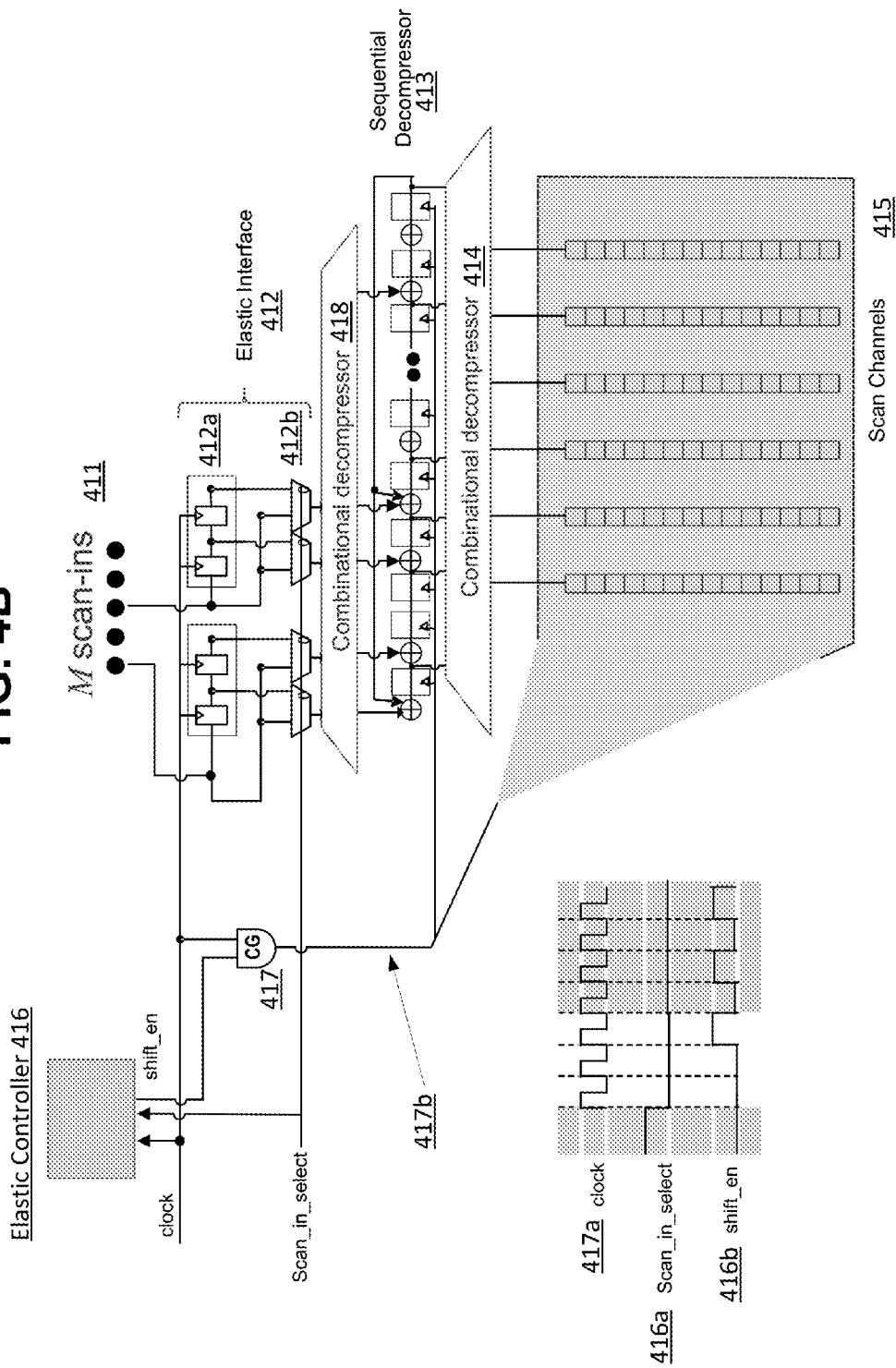
FIG. 4B illustrates an embodiment of elements of the multi-stage decompressor network system with a 2-bit deserializer.

FIG. 4B illustrates a second embodiment of the elements of the multi-stage decompressor network system with a 2-bit deserializer. In an embodiment, system 410 in FIG. 4B functions similarly to the system in FIG. 4A. However, system 410 in FIG. 4B includes a further combinational decompressor 418 between the MUX stage 412b and sequential decompressor 413. The combinational decompressor 418 applies combinational logic to inputs at tap points of sequential decompressor 413.

Figure 5A:
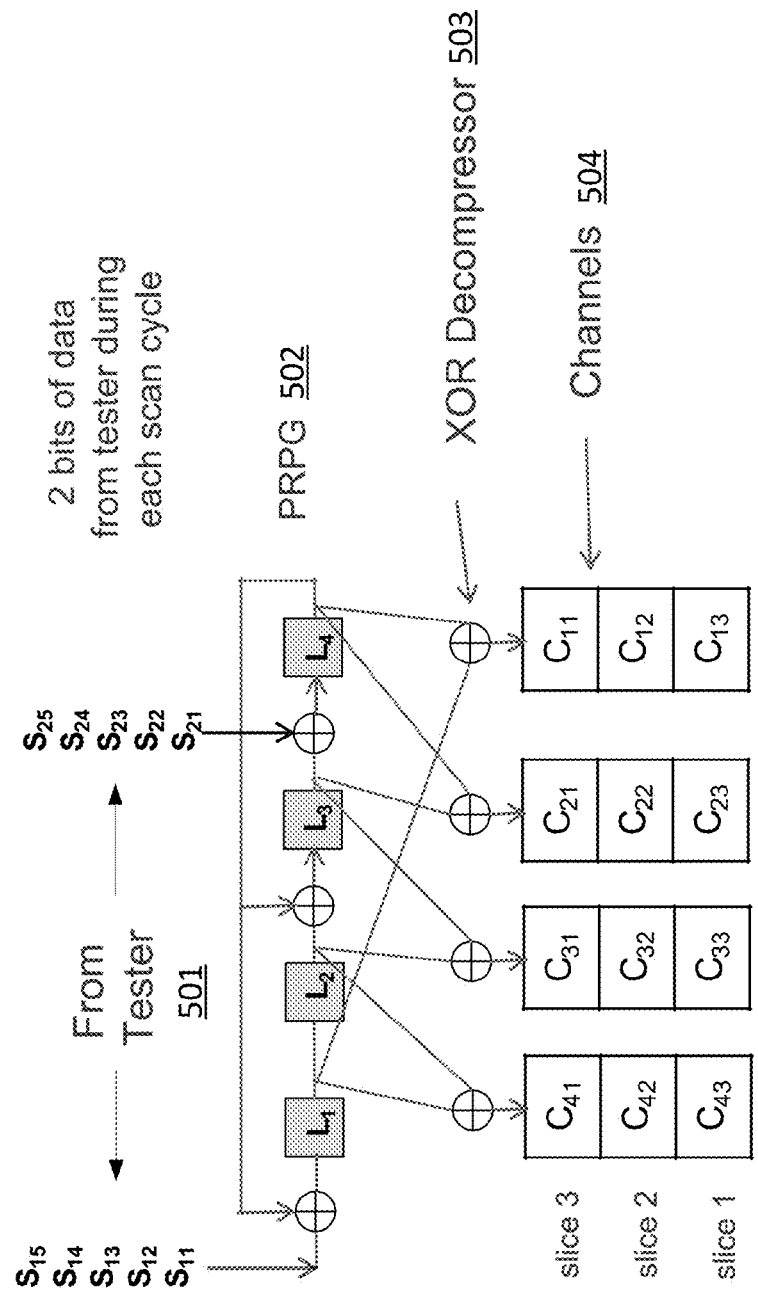
FIG. 5A illustrates elements of a sequential decompressor system without a deserializer.

FIG. 5A illustrates elements of a sequential decompressor system. System 500, which receives input signals 501 from the tester, includes a sequential decompressor 502 (e.g., a PRPG), a combinational decompressor 503 (e.g., XOR decompressor) and scan channels 504. In an embodiment, two bits of data come in from the tester as input signals 501 for each scan cycle. For example, at the first scan cycle, $S_{11}$ and $S_{21}$ come in as input signals 501. In the next scan cycle, $S_{12}$ and $S_{22}$ come in as input signals 501, etc. Input signals 501 are input into PRPG 502 and shifted into shift registers of PRPG 502 for each scan cycle. In an embodiment, each of the signals (e.g., $S_{11}$ and $S_{21}$) is input into a corresponding tap point of the PRPG 502. In another embodiment (not shown), each of the signals (e.g., $S_{11}$ and $S_{21}$) is fanned out to a plurality of tap points of the PRPG 502 (i.e., a duplicate of the signal is sent to each tap point). Further, input signals 501 are XORed with the shifted values of PRPG 502 (including initial state values of the shift registers $L_1$, $L_2$, $L_3$ and $L_4$) for each scan cycle. In an embodiment, the outputs of the shift registers $L_1$, $L_2$, $L_3$ and $L_4$ are fed to an XOR decompressor 503. The output of XOR decompressor 503 is input to scan channels 504 at each scan cycle.

FIG. 5B illustrates the linear equations for the scan channel bits after the sequential decompressor of FIG. 5A runs for longer than the length of the longest scan channel. Specifically, FIG. 5B illustrates the linear equations for the scan channel bits after the sequential decompressor of FIG. 5A runs for five clock cycles. As depicted in FIG. 5B, after five clock cycles, the linear equations for the scan channel bits for the last three slices (e.g., the top three slices) all include input variables (e.g., data from inputs signals 501). Therefore, care bits corresponding to the bit positions in the top three slices will most likely be solved. In an embodiment, the shift registers of PRPG 502 and the scan channels 504 are clocked at the same timing signal. In other words, data is shifted down into the scan channels 504 while the PRPG 502 is being primed with the input variables. Accordingly, there is no need to freeze the clocks of the scan channels 504 while the PRPG 502 is being primed. Therefore, there is no need for additional hardware and/or control pins in order to prime the PRPG 502.

In an embodiment, as depicted in FIG. 5B, the earlier cycles (e.g., corresponding to channel bit equations with no input variables) are flushed out (e.g., removed). Specifically, the earliest two cycles (e.g., the bottom two slices) are flushed out. Accordingly, the final channel content will include only the top three slices. In an embodiment, the earliest scan cycles are flushed out at the end of the scan process (e.g., after the equations for each channel bit of the scan channels all include input variables). In an embodiment, the lengths of each scan channel of the scan channels 504 could be different. Accordingly, in an embodiment, knowing the lengths of each scan channel of the scan channels 504 makes it possible to determine which scan cycles of which channel to flush out at the end of the scan process. In an embodiment, the scan process can be overscanned by at least one clock cycle greater than the length of the longest scan channel. In another embodiment, assuming each of the signals (e.g., $S_{11}$ and $S_{21}$) is input into a corresponding tap point of the PRPG 502, the scan process can be overscanned at a clock cycle that is less than the number of PRPG bits divided by the number of scan-in inputs, meaning that the scan process is overscanned enough to prime the PRPG bits. Accordingly, the scan process of FIG. 5A only needs to be overscanned by two clock cycles (e.g., 4 PRPG bits divided by 2 scan-in inputs).

FIG. 5C illustrates the state of each bit in the PRPG of FIG. 5A after running for longer than the length of the longest scan channel. Similarly to FIG. 5B, the PRPG in FIG. 5C is run for five clock cycles. Further, as depicted in FIG. 5B, after clock cycle three, all of the shift registers of PRPG 502 are primed with input variables.

Figure 5D:
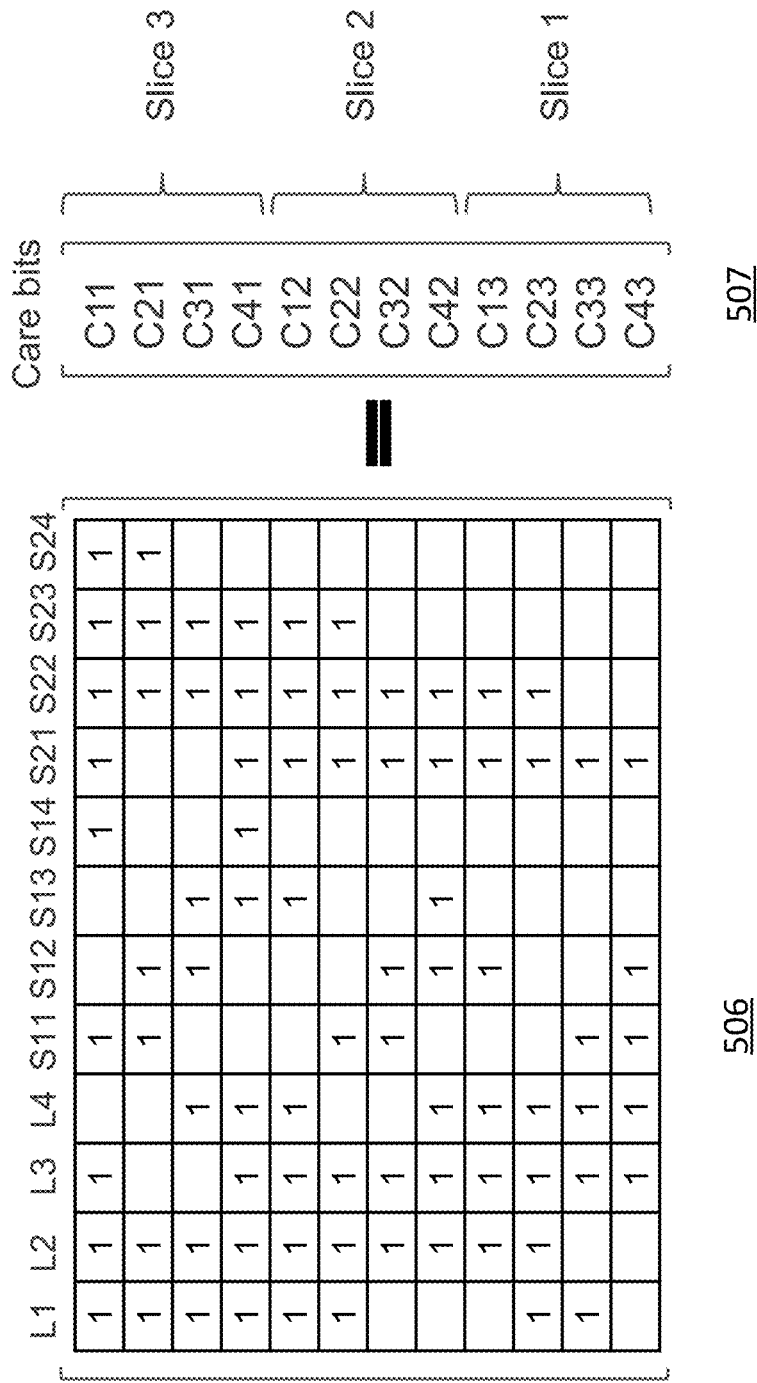
FIG. 5D depicts the system of linear equations for the sequential decompressor of FIG. 5A.

FIG. 5D depicts the system of linear equations for the sequential decompressor of FIG. 5A after running the scan process for five clock cycles (e.g., overscanned). Matrix 506 depicts the linear equation for each of the channel bits in the test pattern. For example, the first row of matrix 506 corresponds to the linear equation for channel bit C11. Similarly, the second row of matrix 506 corresponds to the linear equation for channel bit C21, etc. Vector 507 can be populated based on the care bits of the corresponding scan slices of the test pattern. In an embodiment, the distribution of care bits across the slices does not matter as long as the care bit corresponds to a linear equation for the appropriate channel bit. Further, in an embodiment, L1 to L4 can be removed from matrix 506 as they will most likely be zero as a result of the reset applied at the start of the test. Accordingly, with matrix 506 (e.g., the "a" in ax=b) and vector 507 (e.g., the "b" in ax=b) input variables $S_{11}$, $S_{12}$, $S_{13}$, $S_{14}$, $S_{21}$, $S_{22}$, $S_{23}$ and $S_{24}$ (e.g., the "x" in ax=b) can be determined for the entire test pattern.

Figure 6A:
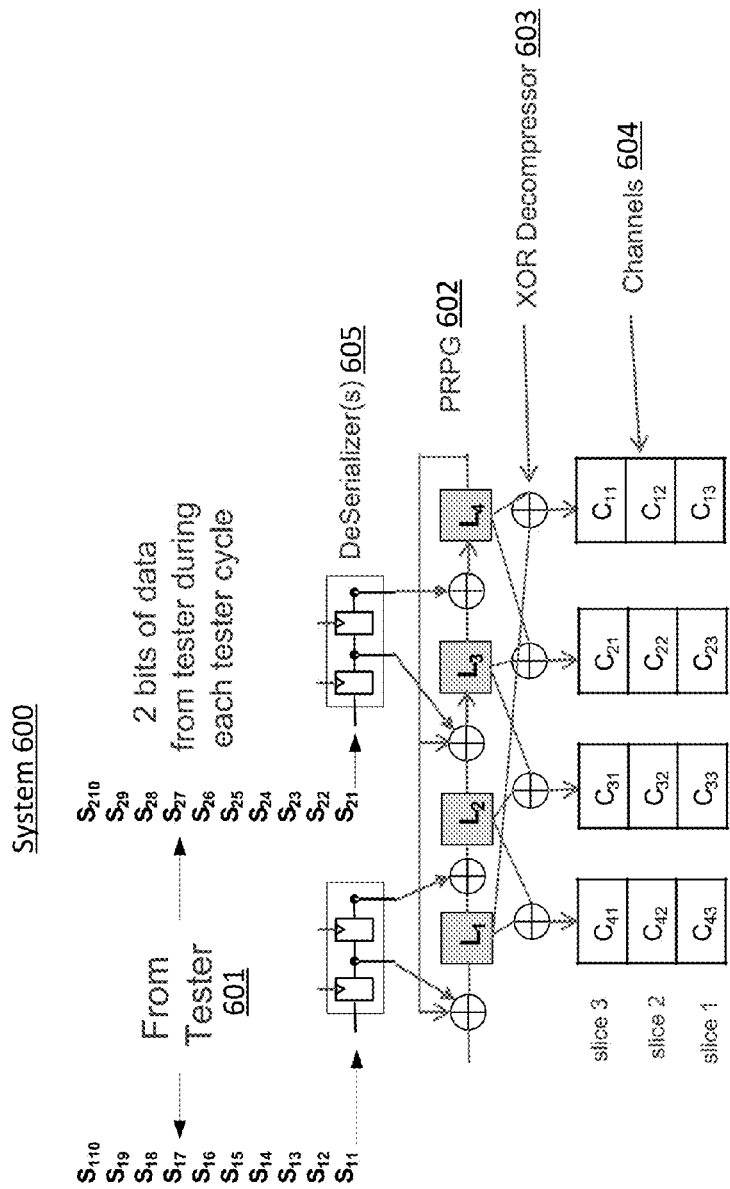
FIG. 6A illustrates elements of a sequential decompressor system using a 2-bit deserializer.

FIG. 6A illustrates the elements of a sequential decompressor system using a 2-bit deserializer. System 600, which receives input signals 601 from the tester, includes a sequential decompressor 602 (e.g., a PRPG), a combinational decompressor 603 (e.g., XOR decompressor), scan channels 604 and deserializer(s) 605 (e.g., a 2-bit deserializer). In an embodiment, two bits of data come in from the tester as input signals 601 for each tester cycle. For example, at the first tester cycle, $S_{11}$ and $S_{21}$ come in as input signals 601. In an embodiment, each of signals $S_{11}$ and $S_{21}$ is input into a first shift register of deserializer 605. In the next tester cycle, (i) signals $S_{11}$ and $S_{21}$ are shifted from the first shift register to a second shift register of the deserializer 605 and (ii) new input signals $S_{12}$ and $S_{22}$ are loaded onto the first shift register of the deserializer 605. In this fashion, the deserializer 605 operates under the waveform in FIGS. 4A-4B. Accordingly, the outputs of each of the shift registers of the deserializer 605 are fed into different tap points of PRPG 602 and shifted into shift registers of PRPG 602 for each scan cycle. Further, the outputs of the shift registers of the deserializer 605 are XORed with the shifted values of PRPG 602 (including initial state values of the shift registers $L_1$, $L_2$, $L_3$ and $L_4$) for each scan cycle. In an embodiment, the outputs of the shift registers $L_1$, $L_2$, $L_3$ and $L_4$ are fed to an XOR decompressor 603. The output of XOR decompressor 603 is input to scan channels 604 at each scan cycle. Accordingly, by feeding the input signals to several tap points of the PRPG 602, the linear equations corresponding to the channel bits will be supplied with more variables. Thus, the equation solver will be provided with more degrees of freedom when attempting to solve for a particular fault.

FIG. 6B illustrates the linear equations for the scan channel bits after the sequential decompressor of FIG. 6A runs for longer than the length of the longest scan channel. Specifically, FIG. 6B illustrates the linear equations for the scan channel bits after the sequential decompressor of FIG. 6A runs for five scan clock cycles. As depicted in FIG. 6B, after five scan clock cycles, the linear equations for the scan channel bits for the last three slices (e.g., the top three slices) all include input variables. Therefore, care bits corresponding to the bit positions in the top three slices will most likely be solved. In an embodiment, the shift registers of PRPG 602 and the scan channels 604 are clocked at the same timing signal.

In an embodiment, as depicted in FIG. 6B, the earlier cycles (e.g., corresponding to channel bit equations with no input variables) are flushed out (e.g., removed). Specifically, the earliest two cycles (e.g., the bottom two slices) are flushed out. Accordingly, the final channel content will include only the top three slices. In an embodiment, the earliest scan cycles are flushed out at the end of the scan process (e.g., after the equations for each channel bit of the scan channels all include input variables). In an embodiment, the lengths of each scan channel of the scan channels 604 could be different. Accordingly, in an embodiment, knowing the lengths of each scan channel of the scan channels 604 makes it possible to determine which scan slices of which channel to flush out at the end of the scan process. In an embodiment, the scan process can be overscanned by at least one clock cycle greater than the length of the longest scan channel. In another embodiment, the scan process can be overscanned at clock cycles that are more than sufficient to prime the PRPG bits in order to provide additional input variables for the equation solver to utilize.

FIG. 6C illustrates the state of each bit in the PRPG of FIG. 6A after running for longer than the length of the longest scan channel. Similarly to FIG. 6B, the PRPG in FIG. 6C is run for five scan clock cycles. Further, as depicted in FIG. 6C, after scan clock cycle three, all of the shift registers of PRPG 602 are primed with input variables.

Figure 6D:
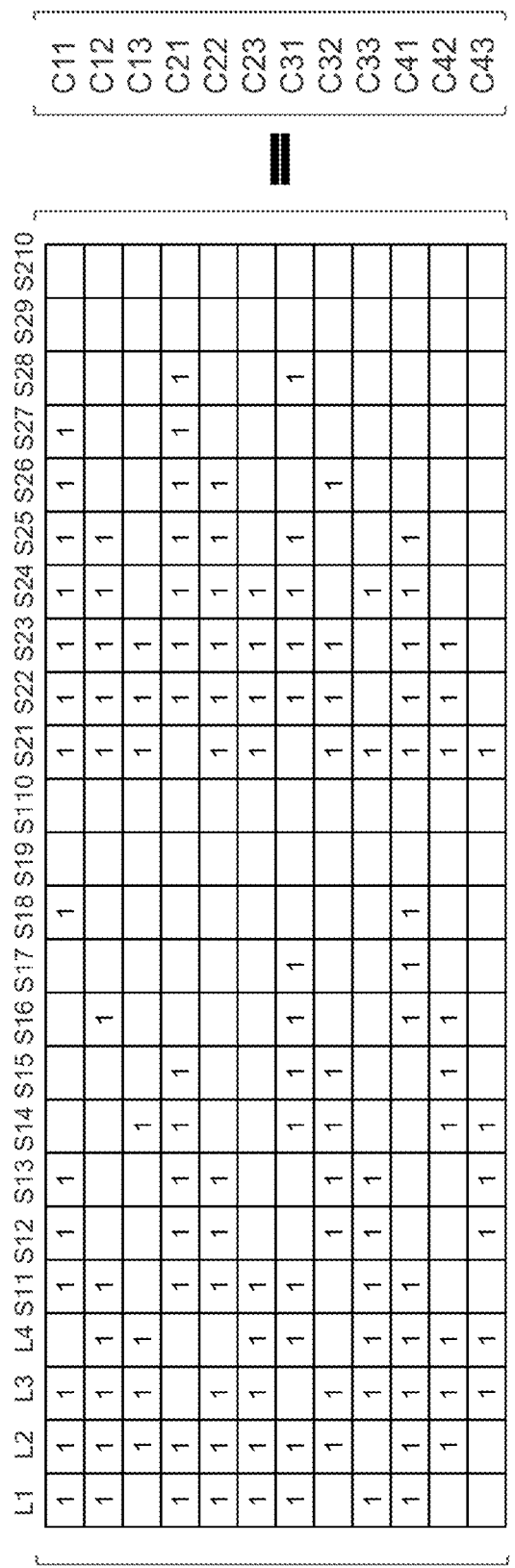
FIG. 6D depicts the system of linear equations for the sequential decompressor of FIG. 6A.

FIG. 6D depicts the system of linear equations for the sequential decompressor of FIG. 6A. Matrix 606 depicts the linear equation for each of the channel bits in the test pattern. For example, the first row of matrix 606 corresponds to the linear equation for channel bit C11. Similarly, the second row of matrix 606 corresponds to the linear equation for channel bit C21, etc. Vector 607 can be populated based on the care bits of the corresponding scan slices of the test pattern. In an embodiment, the distribution of care bits across the slices does not matter as long as the care bit corresponds to a linear equation for the appropriate channel bit. Further, in an embodiment, L1 to L4 can be removed from matrix 606 as they will most likely be zero. Accordingly, with matrix 606 (e.g., the "a" in ax=b) and vector 607 (e.g., the "b" in ax=b) input variables $S_{11}$, $S_{12}$, $S_{13}$, $S_{14}$, $S_{15}$, $S_{16}$, $S_{17}$, $S_{18}$, $S_{19}$, $S_{110}$, $S_{21}$, $S_{22}$, $S_{23}$, $S_{24}$, $S_{25}$, $S_{26}$, $S_{27}$, $S_{28}$, $S_{29}$ and $S_{210}$ (e.g., the "x" in ax=b) can be determined for the entire test pattern.

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. An automatic test pattern generation system, comprising:
   an elastic interface, configured to receive m scan inputs from a tester, wherein, in a first state, the elastic interface outputs the m scan inputs, and, in a second state, the elastic interface outputs i×m scan inputs, wherein i is an integer greater than 1;
a sequential decompressor receiving a plurality of outputs from the elastic interface;
a first combinational decompressor network receiving a plurality of outputs from the sequential decompressor; and
a plurality of scan channels receiving a plurality of outputs from the first combinational decompressor network.

2. The automatic test pattern generation system of claim 1, further comprising:
at least one i-bit deserializer of the elastic interface, configured to receive a scan input of the m scan inputs from the tester; and
a multiplexer stage of the elastic interface including i multiplexers for each of the m scan inputs, each of the multiplexers having a first multiplexer input configured to receive the scan input of the m scan inputs, a second multiplexer input configured to receive an output of a shift register of the at least one i-bit deserializer, and a third multiplexer input configured to receive a control signal,
wherein the sequential decompressor receives one of the first and second multiplexer inputs, based on the control signal.

3. The automatic test pattern generation system of claim 1, further comprising a second combinational decompressor network configured to receive the plurality of outputs from the elastic interface, and to provide a plurality of outputs to the sequential decompressor.

4. The automatic test pattern generation system of claim 1, wherein each register bit inside of the sequential decompressor is shifted at each shift cycle for a total plurality of shift cycles that is greater than a length of a longest scan channel of the plurality of scan channels by at least one.

5. The automatic test pattern generation system of claim 1, further comprising a processor configured to remove the outputs from the first combinational decompressor network at a set of earliest scan cycles of the plurality of scan channels, wherein the set of the earliest scan cycles corresponds to shift cycles in which not all register bits in the sequential decompressor had been updated using the plurality of outputs from the elastic interface.

6. The automatic test pattern generation system of claim 1, further comprising:
a controller providing a control signal; and
a clock gate, configured to receive the control signal at a first input and a clock signal at a second input, and providing a clock output signal to enable or disable a shift into the plurality of scan channels.

7. The automatic test pattern generation system of claim 1, wherein the sequential decompressor is one of (i) a linear shift register and (ii) a linear feedback shift register, and the first combinational decompressor network is at least one of (i) a linear spreader network of XOR logic gates and (ii) a broadcast scan distribution network.

8. A computer-implemented method of generating test patterns, the method comprising:
receiving, at an elastic interface, m scan inputs from a tester;
outputting, from the elastic interface, one of (i) the m scan inputs and (ii) i×m scan inputs to a plurality of inputs of a sequential decompressor, wherein i is an integer greater than 1;
updating, with a plurality of outputs of the elastic interface, bits in the sequential decompressor;
feeding a set of outputs from the sequential decompressor to a first combinational decompressor network; and
feeding a set of outputs from the first combinational decompressor network to a set of scan channels.

9. The computer-implemented method of claim 8, further comprising:
receiving, at (i) at least one i-bit deserializer of the elastic interface and (ii) a first input of a multiplexer of a multiplexer stage of the elastic interface including i multiplexers, a scan input of the m scan inputs from the tester;
receiving, at a second input of the multiplexer, an output of a shift register of the i-bit deserializer;
receiving, at a third input of the multiplexer, a control signal; and
outputting one of the first and second multiplexer inputs to the plurality of inputs of the sequential decompressor based on the control signal.

10. The computer-implemented method of claim 8, further comprising:
receiving, with a second combinational decompressor network, a plurality of outputs from the elastic interface;
feeding a set of outputs from the second combinational decompressor network to the plurality of inputs of the sequential decompressor; and
updating, with the set of outputs from the second combinational decompressor network, register bits resident in the sequential decompressor.

11. The computer-implemented method of claim 8, wherein each register bit inside of the sequential decompressor is shifted at each shift cycle for a total plurality of shift cycles that is greater than a length of a longest scan channel of the set of scan channels by at least one.

12. The computer-implemented method of claim 8, further comprising:
removing the outputs from the first combinational decompressor network at a set of earliest scan cycles of the set of scan channels, wherein the set of the earliest scan cycles corresponds to shift cycles in which not all register bits in the sequential decompressor had been updated using the plurality of outputs from the elastic interface.

13. The computer-implemented method of claim 8, further comprising:
receiving, at a clock gate, a control signal from a controller at a first input and a clock signal at a second input; and
providing, with the clock gate, a clock output signal to enable or disable a shift into the set of scan channels.

14. The computer-implemented method of claim 8, wherein the sequential decompressor is one of (i) linear shift register and (ii) a linear feedback shift register, and the first combinational decompressor network is at least one of (i) a linear spreader network of XOR logic gates and (ii) a broadcast scan distribution network.

15. A non-transitory computer readable medium containing program instructions for generating test patterns, wherein execution of the program instructions by one or more processors of a computer system causes one or more processors to perform the following:
receive, at an elastic interface, m scan inputs from a tester;
output, from the elastic interface, one of (i) the m scan inputs and (ii) i×m scan inputs to a plurality of inputs of a sequential decompressor, wherein i is an integer greater than 1;

update, with a plurality of outputs of the elastic interface, register bits resident inside the sequential decompressor;

feed a set of outputs from the sequential decompressor to a first combinational decompressor network; and feed a set of outputs from the first combinational decompressor network to a set of scan channels.

16. The non-transitory computer readable medium of claim 15, wherein execution of the program instructions by one or more processors of a computer system further causes one or more processors to perform the following:

receive, at (i) at least one i-bit deserializer of the elastic interface and (ii) a first input of a multiplexer of a multiplexer stage of the elastic interface including i multiplexers, a scan input of the m scan inputs from the tester;

receive, at a second input of the multiplexer, an output of a shift register of the i-bit deserializer;

receive, at a third input of the multiplexer, a control signal; and output one of the first and second multiplexer inputs to the plurality of inputs of the sequential decompressor based on the control signal.

17. The non-transitory computer readable medium of claim 15, wherein execution of the program instructions by one or more processors of a computer system further causes one or more processors to perform the following:

receive, with a second combinational decompressor network, a plurality of outputs from the elastic interface;

feed a set of outputs from the second combinational decompressor network to the plurality of inputs of the sequential decompressor; and update, with the set of outputs from the second combinational decompressor network, bits in the sequential decompressor.

18. The non-transitory computer readable medium of claim 15, wherein each register bit inside of the sequential decompressor is shifted at each shift cycle for a total plurality of shift cycles that is greater than a length of a longest scan channel of the set of scan channels by at least one.

19. The non-transitory computer readable medium of claim 15, wherein execution of the program instructions by one or more processors of a computer system further causes one or more processors to perform the following:

remove the outputs from the first combinational decompressor network at a set of earliest scan cycles of the set of scan channels, wherein the set of the earliest scan cycles corresponds to shift cycles in which not all register bits in the sequential decompressor had been updated using the plurality of outputs from the elastic interface.

20. The non-transitory computer readable medium of claim 15, wherein the sequential decompressor is one of (i) linear shift register and (ii) a linear feedback shift register, and the first combinational decompressor network is at least one of (i) a linear spreader network of XOR logic gates and (ii) a broadcast scan distribution network.

* * * * *